US007241394B2

(12) United States Patent
Dinu et al.

(10) Patent No.: US 7,241,394 B2
(45) Date of Patent: *Jul. 10, 2007

(54) PROCESS OF FABRICATING POLYMER SUSTAINED MICROELECTRODES

(75) Inventors: Raluca Dinu, Redmond, WA (US); Jeffrey K. Kressbach, Snohomish, WA (US)

(73) Assignee: Lumera Corporation, Bothell, WA (US)

(*) Notice: Subject to any disclaimer, the term of this patent is extended or adjusted under 35 U.S.C. 154(b) by 454 days.

This patent is subject to a terminal disclaimer.

(21) Appl. No.: 10/761,902

(22) Filed: Jan. 21, 2004

(65) Prior Publication Data

US 2005/0158849 A1    Jul. 21, 2005

(51) Int. Cl.
*H01B 13/00* (2006.01)
*H01L 21/00* (2006.01)

(52) U.S. Cl. ............... 216/13; 216/2; 216/41; 216/83; 216/100; 438/689; 438/706; 438/745

(58) Field of Classification Search .......... 216/2, 216/13, 41, 83, 100; 438/745, 689, 706
See application file for complete search history.

(56) References Cited

U.S. PATENT DOCUMENTS

| | | |
|---|---|---|
| 5,120,339 A | 6/1992 | Markovich et al. |
| 5,198,513 A | 3/1993 | Clement et al. |
| 5,219,788 A | 6/1993 | Abernathey et al. |
| 5,223,356 A | 6/1993 | Kumar et al. |
| 5,370,969 A | 12/1994 | Vidusek |
| 5,433,895 A | 7/1995 | Jeng et al. |
| 5,480,687 A | 1/1996 | Heming et al. |
| 5,497,445 A | 3/1996 | Imoto |
| 5,631,735 A | 5/1997 | Nagai |
| 5,635,576 A | 6/1997 | Foll et al. |
| 5,714,304 A | 2/1998 | Gibbons et al. |
| 5,729,641 A | 3/1998 | Chandonnet et al. |
| 5,776,374 A | 7/1998 | Newsham et al. |
| 5,783,319 A | 7/1998 | Reisfeld et al. |
| 5,811,507 A | 9/1998 | Chan et al. |
| 5,861,976 A | 1/1999 | Hoekstra |
| 5,887,116 A | 3/1999 | Grote |
| 6,002,828 A | 12/1999 | Hult et al. |

(Continued)

FOREIGN PATENT DOCUMENTS

EP    961139    1/1999

(Continued)

OTHER PUBLICATIONS

U.S. Appl. No. 10/264,461, Dinu et al.

(Continued)

*Primary Examiner*—Shamim Ahmed
(74) *Attorney, Agent, or Firm*—Fish & Richardson P.C.

(57) ABSTRACT

A process for fabricating a microelectrode is described that includes: a) providing a substrate comprising at least one polymer micro-ridge, where the polymer micro-ridge comprises an upper surface and two walls, and the two walls form an angle with a lower surface; b) depositing a metal thin film on the upper surface, the two walls, and the lower surface; and c) etching a predetermined amount of the deposited metal thin film on the lower surface to form the microelectrode.

34 Claims, 12 Drawing Sheets

U.S. PATENT DOCUMENTS

| | | |
|---|---|---|
| 6,019,906 A | 2/2000 | Jang et al. |
| 6,020,110 A * | 2/2000 | Williams et al. ............ 430/315 |
| 6,031,945 A | 2/2000 | You et al. |
| 6,060,170 A | 5/2000 | Burgoyne, Jr. |
| 6,117,967 A | 9/2000 | Fuller et al. |
| 6,126,867 A | 10/2000 | Kanitz et al. |
| 6,229,949 B1 | 5/2001 | Ido et al. |
| 6,294,573 B1 | 9/2001 | Curtin et al. |
| 6,303,730 B1 | 10/2001 | Fries et al. |
| 6,306,563 B1 | 10/2001 | Xu et al. |
| 6,323,361 B1 | 11/2001 | Wu et al. |
| 6,335,149 B1 | 1/2002 | Xu et al. |
| 6,419,989 B1 | 7/2002 | Betz et al. |
| 6,451,240 B1 * | 9/2002 | Sherman et al. ............ 264/504 |
| 6,466,707 B1 | 10/2002 | Dawes et al. |
| 6,473,551 B2 | 10/2002 | Norwood et al. |
| 6,525,867 B1 | 2/2003 | Oakley et al. |
| 6,544,820 B2 * | 4/2003 | Jiang et al. ................. 438/125 |
| 6,852,563 B1 * | 2/2005 | Dinu et al. ................... 438/57 |
| 2002/0160282 A1 | 10/2002 | Huang et al. |
| 2003/0085398 A1 | 5/2003 | Koyama et al. |

FOREIGN PATENT DOCUMENTS

| | | |
|---|---|---|
| JP | 04238305 | 8/1992 |
| JP | 09258151 | 10/1997 |
| JP | 10049443 | 2/1998 |
| JP | 10232323 | 9/1998 |
| JP | 2001255426 | 9/2001 |
| WO | WO 01/40849 | 6/2001 |
| WO | WO 2004/055897 | 7/2004 |

OTHER PUBLICATIONS

U.S. Appl. No. 10/301,978, Huang et al.

Bailey et al., "Step and flash imprint lithography: Template surface treatment and defect analysis," *J. Vac. Sci. Technol. B*, 2000, 18(6):3572-3577.

Chen et al., "Thermosetting Polyurethanes with Stable and Large Second-Order Optical Nonlinearity," *Macromolecules*, 1992, 25:4032-4035.

Grote et al., "Effect of conductivity and dielectric constant on the modulation voltage for optoelectronic devices based on nonlinear optical polymers," *Opt. Eng.*, 2001, 40(11):2464-2473.

Ma et al., "A Novel Class of High-Performance Perfluorocyclobutane-Containing Polymers for Second-Order Nonlinear Optics," *Chem. Mater.*, 2000, 12:1187-1189.

Ma et al., "Highly Efficient and Thermally Stable Nonlinear Optical Dendrimer for Electrooptics," *J. Am. Chem. Soc.*, 2001, 123:986-987.

Mao et al., "Progress toward Device-Quality Second-Order Nonlinear Optical Materials. 1. Influence of Composition and Processing Conditions on Nonlinearity, Temporal Stability, and Optical Loss," *Chem. Mater.*, 1998, 10:146-155.

Oh et al., "Electro-optic polymer modulators for 1.55 µm wavelength using phenyltetraene bridged chromophore in polycarbonate," *Appl. Phys. Lett.*, 2000, 76(24):3525-3527.

Resnick et al., "Release Layers for Contact and Imprint Lithography," *Semicon. Int.*, Jun. 2002, online version, 7 pgs.

* cited by examiner

Figure 1
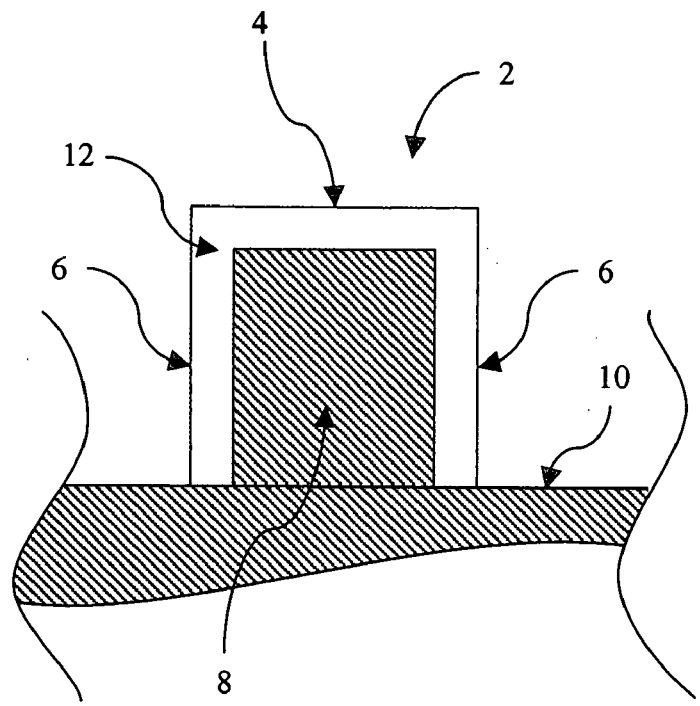
*Fig. 1a*
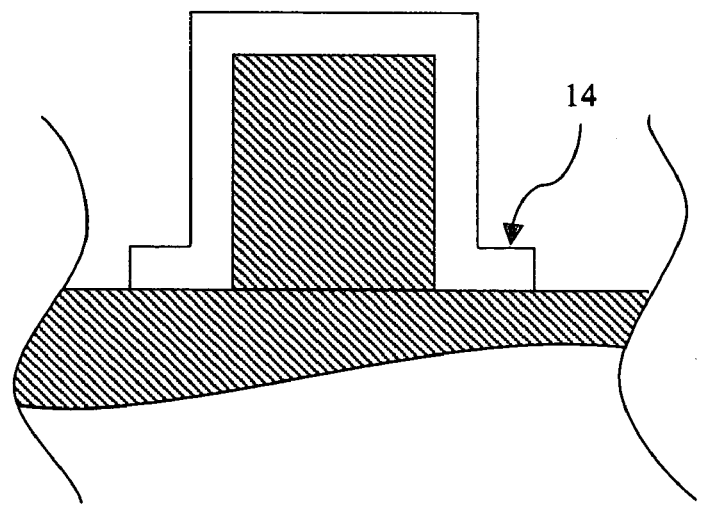
*Fig. 1b*

Figure 2
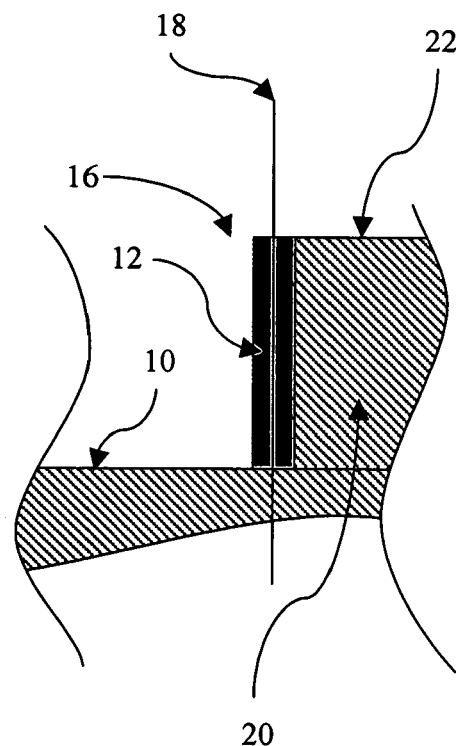
*Fig. 2a*
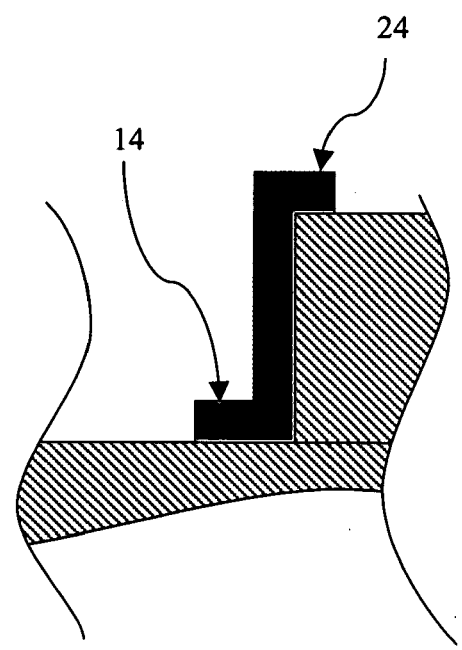
*Fig. 2b* metal deposition metal etching

*(continued from Figure 7)*

↓ polymer deposition

38

↓ poling

PROCESS OF FABRICATING POLYMER SUSTAINED MICROELECTRODES

STATEMENT OF RELATED CASES

This application is related to the following concurrently filed, commonly assigned patent applications, each of which is incorporated by reference: (a) Dinu et al., U.S. Ser. No. 10/761,742, now pending entitled "Polymer Sustained Microelectrodes;" (b) Dinu et al., U.S. Ser. No. 10/762,030, now U.S. Pat. No. 6,852,563, entitled "Process of Fabricating Electro-Optic Polymer Devices with Polymer Sustained Microelectrodes;" and (c) Jin, "Fluorinated Sol-Gel Electro-Optic Materials, Process for Producing Same, and Devices Therefrom U.S. Ser. No. 10/761,862, now U.S. Pat. No. 7,125,949."

BACKGROUND OF THE INVENTION

All patents, patent applications, and publications cited within this application are incorporated herein by reference to the same extent as if each individual patent, patent application or publication was specifically and individually incorporated by reference.

Microelectrodes and microelectrode arrays are useful, for example, in microelectronics, semiconductor chips, integrated microanalysis chips (i.e., "labs on a chip"), electro-optics, and electro-chemical nucleic acid arrays. One conventional method of fabricating a microelectrode is to photolithographically pattern photoresist on a metal thin film, and then wet etch areas of metal to leave the behind the electrode. One disadvantage to this approach is that certain critical dimensions such as combinations of electrode spacing and thickness (height) may be difficult to achieve because wet etching is an isotropic process. Another disadvantage is that the electrode walls after wet etching can be relatively rough. Dry etching, which can be anisotropic and used to produce less wall roughness, is difficult to achieve on the most useful electrode metals like gold.

The "lift-off" technique has been used as an alternative to wet etching. The lift-off technique involves patterning a photoresist on a surface then depositing a metal on the surface and the photoresist and then stripping the gold covered photoresist to leave behind the metal electrode. This technique usually requires a directional deposition of the metal since conformal coverage on the photoresist walls will not allow the stripper to dissolve the photoresist. Evaporation is typically used for directional deposition, but this is difficult to utilize in high volumes.

Physical vapor deposition (PVD) of metals, which is well proven in the semi-conductor industry, is difficult to use in a lift-off process since the coverage in conformal. PVD can be used with a "two-layer" photoresist lift-off technique. In a two-layer process, the walls of the bottom layer of photoresist are recessed compared to the walls of the upper layer. The PVD conformal coverage occurs on the walls of the upper layer of photoresist and the surface. A gap is left near the recessed walls of the lower layer, thereby allowing the stripper to dissolve and remove the photoresist, leaving behind the metal electrode. One disadvantage to this approach is that the walls of the electrode can be slanted significantly.

SUMMARY OF THE INVENTION

One embodiment is a microelectrode comprising an upper surface, two walls, and a polymer core, each of the two walls forming an angle with a lower surface, wherein the upper surface and each of the two walls comprise a metal thin film in contact with the polymer core, and the lower surface lacks a continuous metal thin film. The areas of the lower surface that are not covered with metal provide electrical isolation for the metal covering the upper surface and two walls, which allows the metal to be used as an electrode. The polymer core may comprise a linear polymer, a crosslinked polymer, an organically modified sol-gel, or any combination thereof. Another embodiment is a microelectrode comprising a metal thin film, the metal thin film having a thickness and a plane bisecting the thickness, the plane forming an angle with a lower surface, wherein: the metal thin film is in contact with a supporting polymer, the supporting polymer having an upper surface; the lower surface lacks a continuous metal thin film; and the upper surface lacks a continuous metal thin film. The lower surface and the upper surface lack a continuous metal thin film. The supporting polymer may comprise a linear polymer, a crosslinked polymer, an organically modified sol-gel, or any combination thereof. Other embodiments include microelectrode arrays comprising the microelectrodes described herein.

Another embodiment is a process for fabricating a microelectrode comprising: a) providing a substrate comprising at least one polymer micro-ridge, wherein the polymer micro-ridge comprises an upper surface and two walls, the two walls forming an angle with a lower surface; b) depositing a metal thin film on the upper surface, the two walls, and the lower surface; and c) etching a predetermined amount of the deposited metal thin film on the lower surface to form the microelectrode. Etching a predetermined amount of the deposited metal thin film on the lower surface exposes a portion of the lower surface, thereby providing electrical isolation between the micro-ridge covered with metal and any other area of metal; the electrical isolation allows the metal-covered micro-ridge to be used as an electrode. Another embodiment is a process for fabricating a microelectrode that comprises: a) providing a substrate comprising at least one polymer micro-ridge, wherein the polymer micro-ridge comprises an upper surface and at least one wall, the wall forming an angle with a lower surface; b) depositing a metal thin film on the upper surface, the wall, and the lower surface; c) etching a predetermined amount of the deposited metal thin film on the lower surface or the deposited metal thin film on the upper surface; and d) etching a predetermined amount of the other of the deposited metal thin film on upper surface or the deposited metal thin film on the lower surface, thereby leaving a metal thin film on the wall. In one embodiment, the deposited metal thin film on the upper surface is etched first, followed by the deposited metal thin film on the lower surface. Preferably, however, the deposited metal thin film on the lower surface is etched first, followed by deposited metal thin film on the upper surface.

Another embodiment is a process for fabricating an electro-optic device, comprising: a) providing a substrate comprising at least two polymer micro-ridges, wherein each polymer micro-ridge comprises an upper surface and two walls, the two walls forming an angle with a lower surface; b) depositing a metal thin film on the upper surface, the two walls, and the lower surface; c) etching a predetermined amount of the deposited metal thin film on the lower surface, thereby forming two electrodes separated by a gap; d) depositing a nonlinear optical polymer in the gap between the two electrodes; and e) poling the nonlinear optical polymer to induce electro-optic activity. Preferably, the process further comprises dry etching the electro-optic polymer so that the surface of the electro-optic polymer is substantially co-planar with the upper surface of the polymer micro-ridge. In some embodiments, the process further includes etching the upper surface to remove a predetermined amount of metal thin film from the upper surface.

Another embodiment is a process comprising: a) reacting an alkoxysilane, an (epoxy)alkoxysilane, and a fluorinated alkoxysilane to form a fluorinated sol-gel polymer; and b) reacting a nonlinear optical chromophore comprising a donor, a π-bridge, an acceptor, and at least one alkoxysilyl group with the fluorinated sol-gel polymer to form a nonlinear optical fluorinated sol-gel polymer. The resulting nonlinear optical sol-gel polymer can then be formed into structures that can be poled to induce electro-optic activity. Another embodiment is a composition made by the process described above. Such compositions may be useful, for example, in fabrication electro-optic devices. Other embodiments include electro-optic devices comprising the composition made by the process described above. The electro-optic devices may include, for example, Mach-Zehnder modulators, directional couplers, and micro-ring resonators.

Other features and advantages of the invention will be apparent from the following description of preferred embodiments thereof, and from the claims.

BRIEF DESCRIPTION OF THE DRAWINGS

FIG. 1 illustrates in cross-sectional views some examples of microelectrodes including a polymer core.

FIG. 2 illustrates in cross-sectional views some examples of microelectrodes including forming an angle with a lower surface and disposed on a supporting polymer.

DETAILED DESCRIPTION

Figure 3:
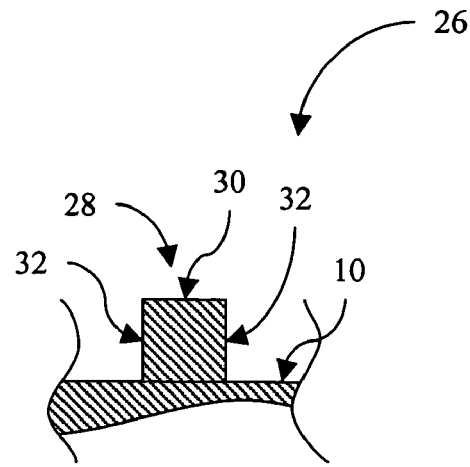
FIGS. 3–6 illustrate in cross-sectional views some examples of process flows that may be used to fabricate the microelectrodes in FIGS. 1 and 2.
Figure 3:
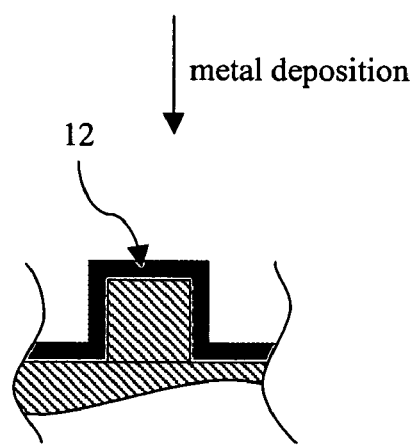
Figure 3:
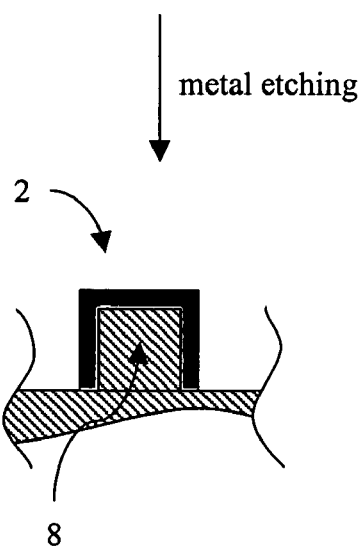

Referring to FIG. 1a, one embodiment is a microelectrode (2) comprising an upper surface (4), two walls (6), and a polymer core (8), each of the two walls forming an angle with a lower surface (10), wherein the upper surface and each of the two walls comprise a metal thin film (12) in contact with the polymer core, and the lower surface lacks a continuous metal thin film. The areas of the lower surface that are not covered with metal (i.e., a metal thin film) provide electrical isolation for the metal covering the upper surface and two walls, which allows the metal to be used as an electrode. However, small areas of the lower surface may be covered with metal to form a "foot" (14, FIG. 1b) if electrical isolation is maintained.

The polymer core may comprise a linear polymer, a crosslinked polymer, an organically modified sol-gel, or any combination thereof. The lower surface preferably comprises silicon dioxide. In some embodiments, the lower surface comprises a polymer. When the lower surface is a polymer, the polymer can be a linear polymer, a crosslinked polymer, an organically modified sol-gel, or any combination thereof. In some embodiments, the polymer core and the lower surface comprise the same polymer.

Preferably, the upper surface and the lower surface are substantially parallel. In most embodiments, the angle between the two walls and the lower surface is about 90 degrees. The metal thin film can comprise any metal or conductive metal alloy. Preferably, the thin film comprises gold, platinum, titanium, or any combination thereof. In many embodiments, the metal thin film has a thickness of about 100 nm to about 5 μm. In some embodiments, the width of the upper surface is about 2 μm to about 500 μm and the height of the two walls is about 200 nm to about 10 μm. The length of the microelectrodes may be about 2 μm to about 200 mm.

Another embodiment, referring to FIG. 2, is a microelectrode (16) comprising a metal thin film (12), the metal thin film having a thickness and a plane (18) bisecting the thickness, the plane forming an angle with a lower surface (10), wherein: the metal thin film is in contact with a supporting polymer (20), the supporting polymer having an upper surface (22); the lower surface lacks a continuous metal thin film; and the upper surface lacks a continuous metal thin film. The areas of the lower surface and the upper surface that are not covered with a metal thin film provide electrical isolation for the metal thin film in contact with the supporting polymer. However, the electrode may have a "foot" (14, FIG. 2b) or an "overhang" (24, FIG. 2b). The supporting polymer may comprise a linear polymer, a crosslinked polymer, an organically modified sol-gel, or any combination thereof. The lower surface may comprise silicon dioxide or a polymer. When the lower surface comprises a polymer, preferably the polymer is a linear polymer, a crosslinked polymer, an organically modified sol-gel, or any combination thereof. In some embodiments, the supporting polymer and the lower surface comprise the same polymer.

Preferably, the metal thin film is selected from the group consisting of gold, platinum, titanium, and any combination thereof. The thickness of the metal thin film may be about 100 nm to about 5 μm. Preferably, the angle between the plane bisecting the thickness and the lower surface is about 90 degrees. The width of the metal thin film, which is measured from the lower surface to the upper surface of the supporting polymer, may be about 200 nm to about 10 μm. Preferably, length of the microelectrode is about 2 μm to about 200 mm.

Other embodiments include a microelectrode array comprising more than one of the microelectrodes described above and illustrated in FIGS. 1 and 2. When there is more than one microelectrode, preferably, the microelectrodes are interdigitated. The microelectrodes described above and microelectrode arrays including those microelectrodes can be fabricated as described below.

Another embodiment is a process for making the electrode illustrated in FIG. 1. Thus, referring to FIG. 3, one embodiment is a process for fabricating a microelectrode comprising: a) providing a substrate (26) comprising at least one polymer micro-ridge (28), wherein the polymer micro-ridge comprises an upper surface (30) and two walls (32), the two walls forming an angle with a lower surface (10); b) depositing a metal thin film (12) on the upper surface, the two walls, and the lower surface; and c) etching a predetermined amount of the deposited metal thin film on the lower surface. Etching a predetermined amount of the deposited metal thin film on the lower surface exposes a portion of the lower surface, thereby providing electrical isolation between the micro-ridge covered with metal and any other area of metal. The polymer micro-ridge functions as the polymer core (8) of the microelectrode (2).

Figure 4:
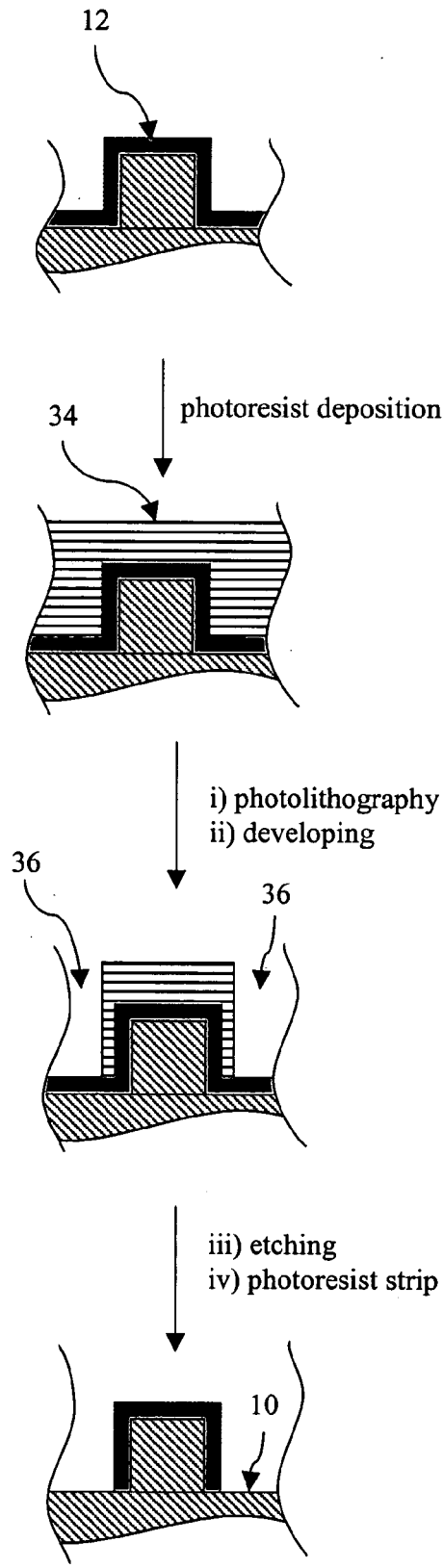

Referring to FIG. 4, the etching may be accomplished, for example, by: 1) depositing a photoresist (34) on the deposited metal thin film; 2) forming vias (36) through the photoresist by photolithographic patterning and developing; and 3) etching a predetermined amount of the deposited metal thin film to expose a portions of the lower surface (10) defined by the vias, and stripping the photoresist. Etching a predetermined amount of the deposited metal thin film, in turn, may comprise techniques such as wet etching, dry etching, ion beam bombardment, or any combination thereof.

Figure 5:
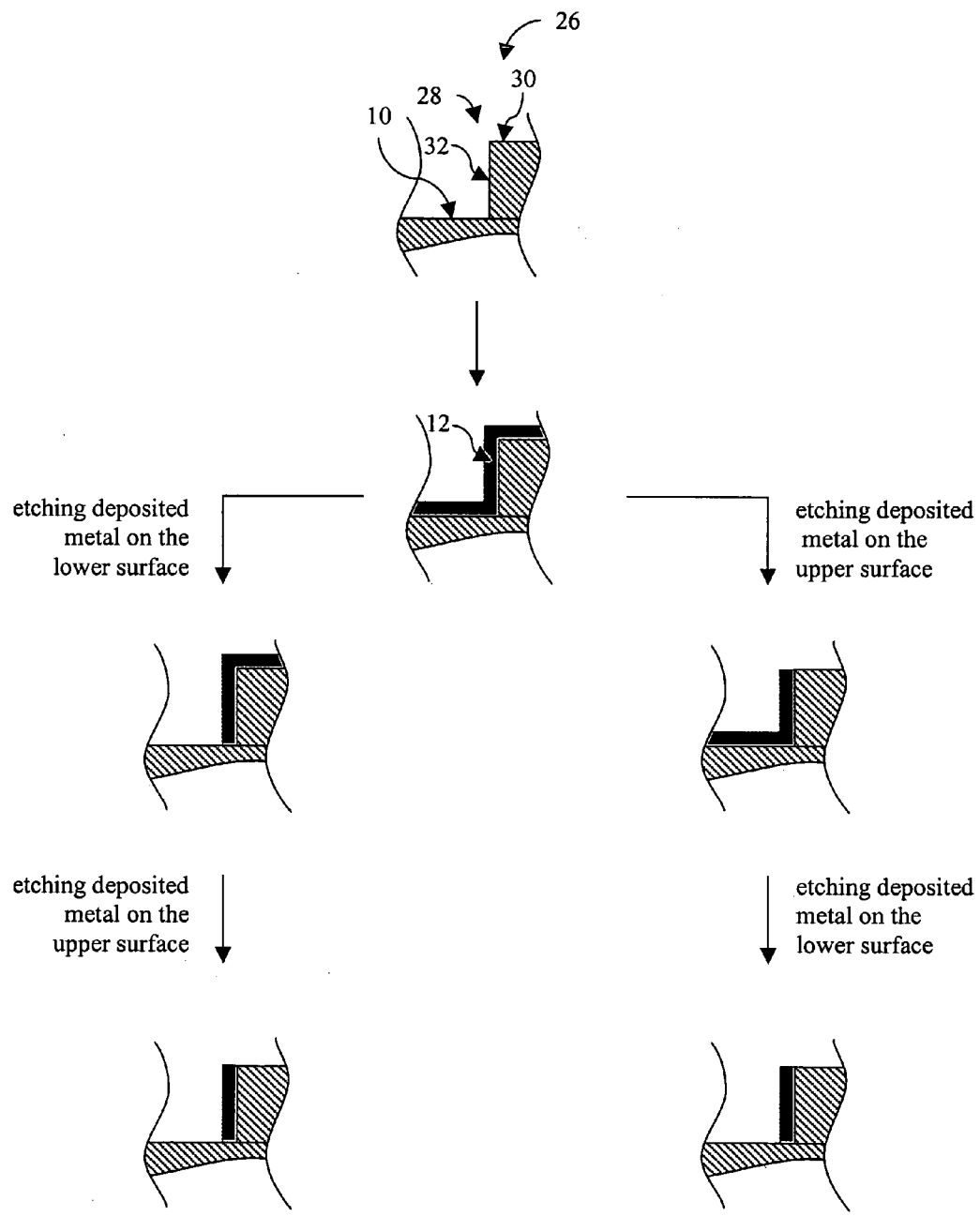
Figure 6:
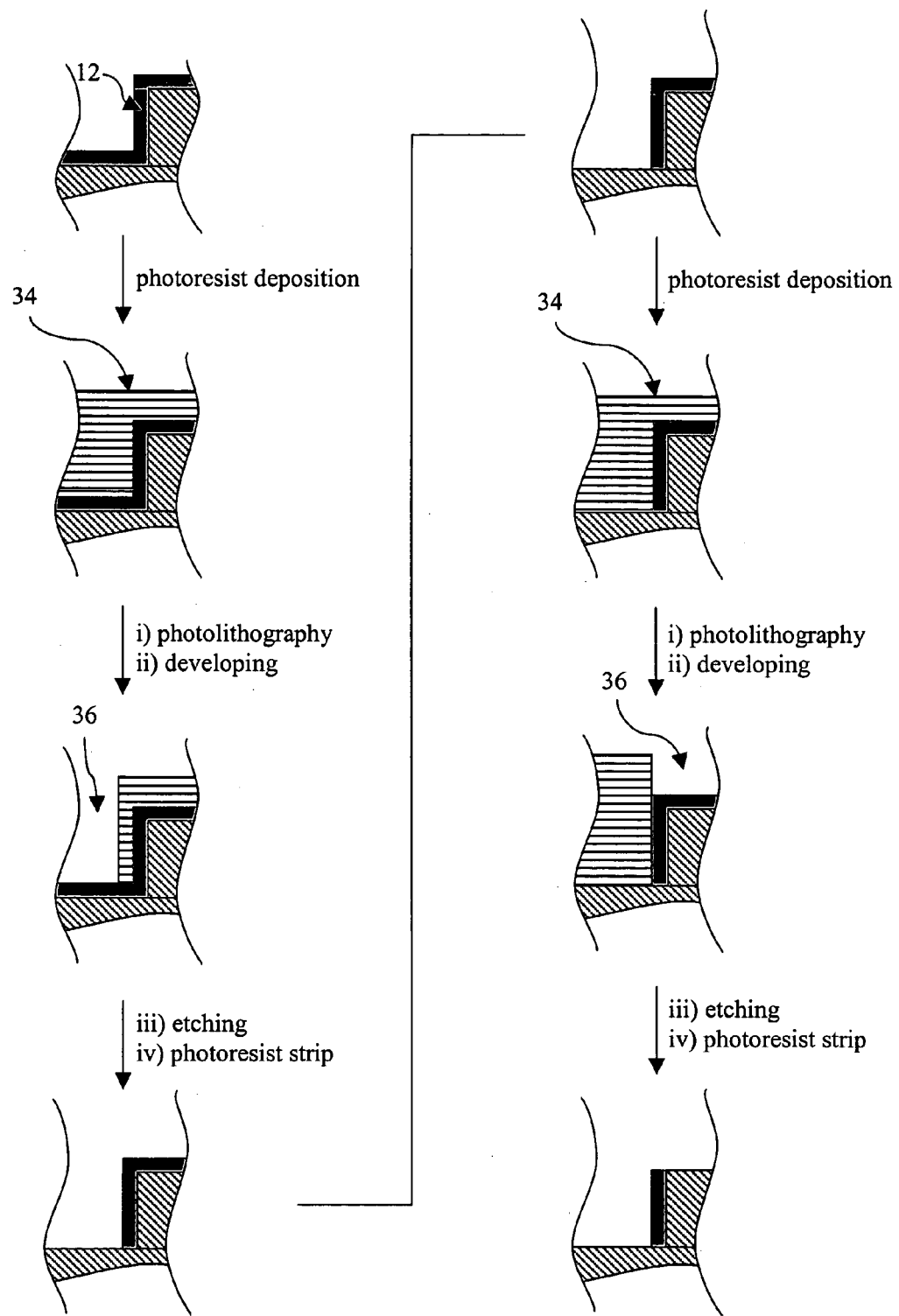

Another embodiment is a process for fabricating the microelectrode illustrated in FIG. 2. Thus, referring to FIG. 5, another embodiment is a process for fabrication a microelectrode that comprises: a) providing a substrate (26) comprising at least one polymer micro-ridge (28), wherein the polymer micro-ridge comprises an upper surface (30) and at least one wall (32), the wall forming an angle with a lower surface (10); b) depositing a metal thin film (12) on the upper surface, the wall, and the lower surface; c) etching a predetermined amount of the deposited metal thin film on the lower surface or the deposited metal thin film on the upper surface; and d) etching a predetermined amount of the other of the deposited metal thin film on upper surface or the deposited metal thin film on the lower surface, thereby leaving a metal thin film on the wall. In one embodiment, the deposited metal thin film on the upper surface is etched first, followed by the deposited metal thin film on the lower surface. Preferably, however, the deposited metal thin film on the lower surface is etched first, followed by deposited metal thin film on the upper surface. FIG. 6 illustrates how, for example, the deposited metal thin film on the lower surface may be etched first followed by the deposited metal thin film on the upper surface: 1) depositing a photoresist (34) on the metal thin film; 2) forming a via (36) through the photoresist to the deposited metal thin film on the lower surface by photolithographic patterning and developing; and 3) etching a predetermined amount the deposited metal thin film on the lower surface defined by the via (36), and stripping the photoresist; 4) depositing photoresist again; 5) forming a via (36) through the photoresist to the deposited metal thin film on the upper surface by photolithographic patterning and developing; 5) etching a predetermined amount the deposited metal thin film on the upper surface defined by the via (36), and stripping the photoresist. Etching a predetermined amount of deposited metal thin film on either the upper surface or the lower surface, in turn, may comprise techniques such as wet etching, dry etching, ion beam bombardment, or any combination thereof.

In the processes described above, the polymer micro-ridge provided can be formed by methods comprising molding, imprinting, photolithographic patterning, and imprint lithography. In one embodiment, providing a substrate comprising at least one polymer micro-ridge comprises dry etching a polymer thin film. The polymer thin film may be provided by methods including spin coating, dip coating, and brushing. Preferably, the polymer micro-ridge comprises a linear polymer, a crosslinked polymer, or an organically modified sol-gel.

In the processes described above, the lower surface may comprise silicon dioxide. Alternatively, the lower surface may comprise a polymer. When the lower surface comprises a polymer, preferably the polymer is a linear polymer, a crosslinked polymer, an organically modified sol-gel, or any combination thereof. In some embodiments, the polymer micro-ridge and the lower surface are the same polymer.

Preferably, the angle between the two walls or at least one wall and the lower surface, is about 90 degrees. The upper surface and lower surface may be substantially parallel to each other. When the upper surface and lower surface are substantially parallel, preferably the wall/s are substantially perpendicular to the upper surface and the lower surface.

The substrate may comprise a plurality of polymer micro-ridges. Preferably, the micro-ridges are interdigitated, which means that the microelectrodes are also interdigitated.

Any metal or conductive alloy can be deposited on the substrate if the metal can be etched in the following steps. Preferably, the metal comprises gold, platinum, titanium, or any combination thereof. The metal thin film may be deposited by methods including physical vapor deposition, thermal evaporation, electroplating, or any combination thereof.

Figure 7:
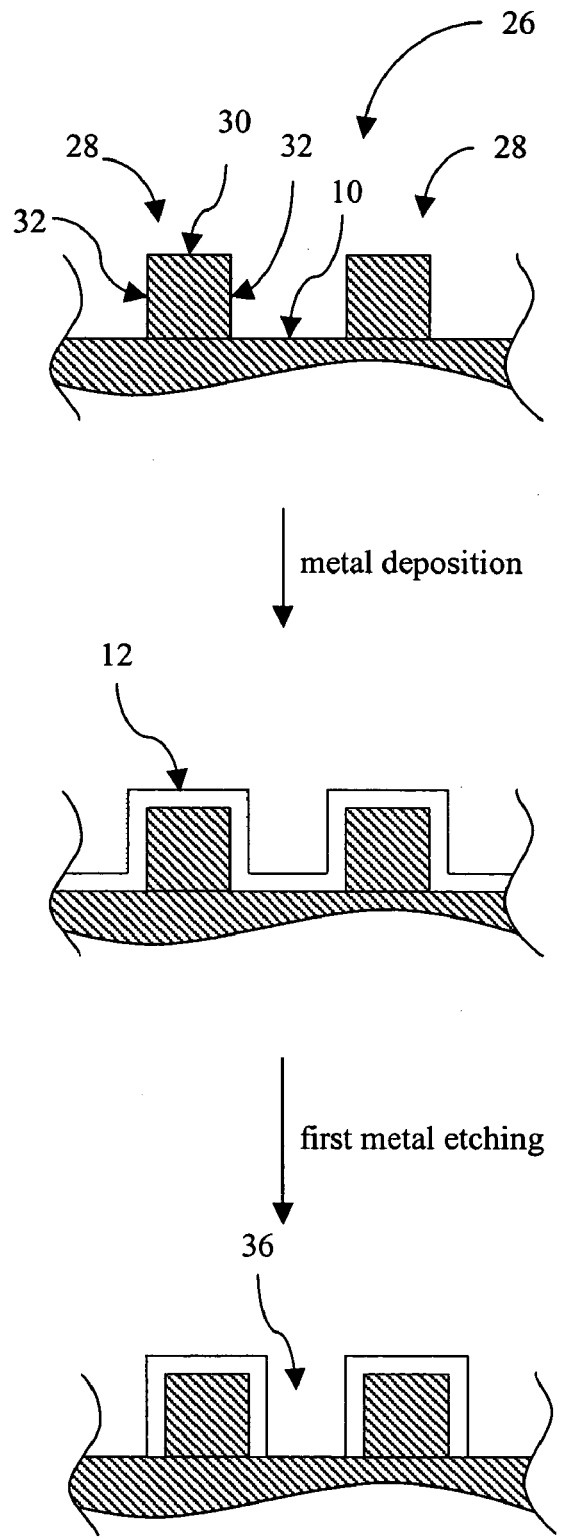
FIGS. 7–9 illustrate in cross-sectional views some examples of processes for fabricating an electro-optic device including the microelectrodes.
Figure 8:
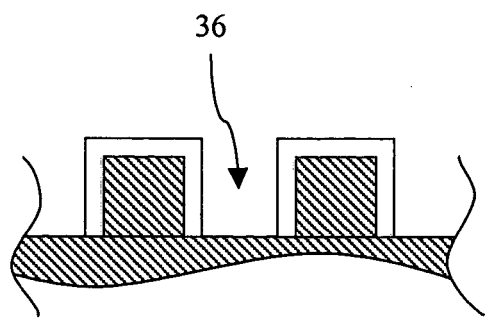
Figure 8:
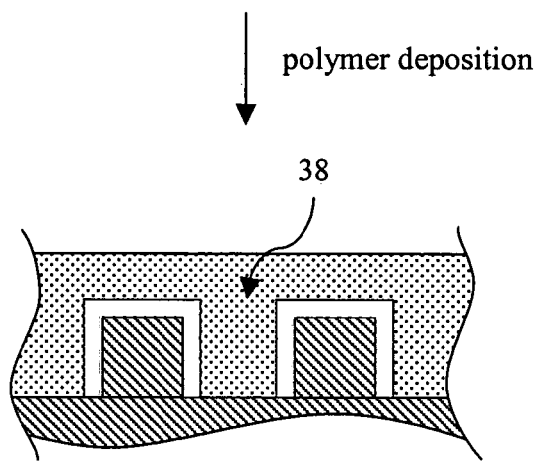
Figure 8:
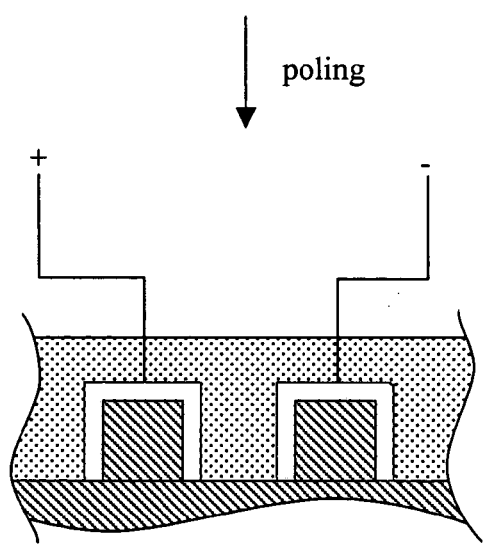
Figure 9:
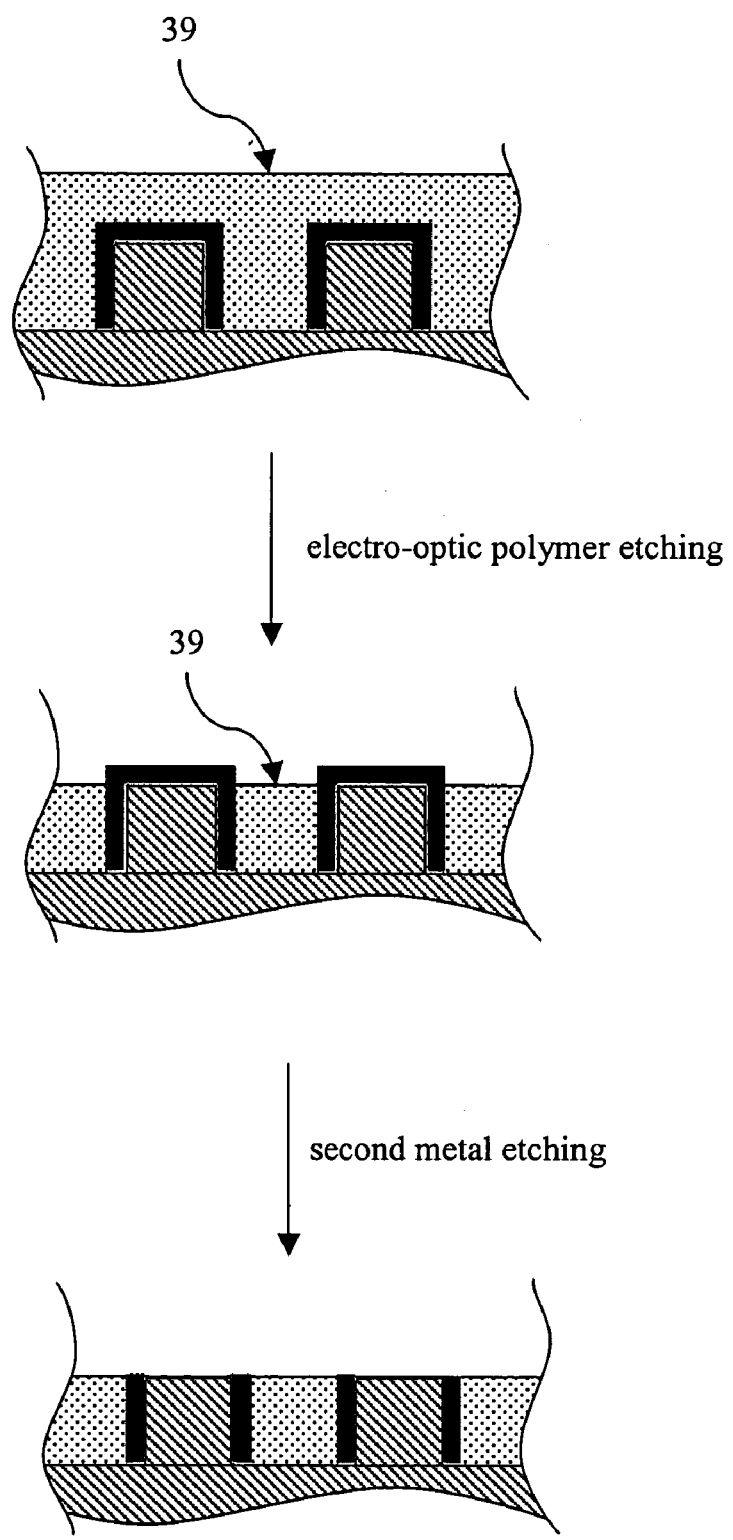

Another embodiment, referring to FIGS. 7 and 8, is a process for fabricating an electro-optic device, comprising: a) providing a substrate (26) comprising at least two polymer micro-ridges (28), wherein each polymer micro-ridge comprises an upper surface (30) and two walls (32), the two walls forming an angle with a lower surface (10); b) depositing a metal thin film (12) on the upper surface, the two walls, and the lower surface; c) etching a predetermined amount of the deposited metal thin film on the lower surface, thereby forming two electrodes separated by a gap (36); d) depositing a nonlinear optical polymer (38) in the gap between the two electrodes; and e) poling the nonlinear optical polymer to induce electro-optic activity. Preferably, referring to FIG. 9, the process further comprises dry etching the electro-optic polymer so that the surface (39) of the electro-optic polymer is substantially co-planar with the upper surface of the polymer micro-ridge. In some embodiments, also referring to FIG. 9, the process further includes etching a predetermined amount of the deposited metal thin film on the upper surface of the polymer micro-ridge. Preferably, the gap (36) is about 2 μm to about 500 μm.

The polymer micro-ridge may comprise a linear polymer, a crosslinked polymer, an organically modified sol-gel, or any combination thereof. The width of the upper surface of the polymer micro-ridge may be about 2 μm to about 500 μm and the height of the two walls may be about 200 nm to about 10 μm. Preferably, the angle between the two walls and the lower surface may be about 90 degrees. The upper surface and lower surface may be substantially parallel.

The composition of the metal thin film and the deposition of the metal thin film may be as described above. Preferably, etching the deposited metal thin film on the lower surface or the deposited metal thin film in the upper surface comprises wet etching, dry etching, ion beam bombardment, or any combination thereof. In some embodiments, the lower surface comprises silicon dioxide or, preferably, the lower surface comprises a polymer. In some embodiments, the polymer micro-ridge and the lower surface comprise the same polymer.

The nonlinear optical polymer may comprise a linear polymer, a crosslinkable polymer, an organically modified sol gel, or any combination thereof. Preferably, the nonlinear optical polymer is crosslinkable. When the nonlinear optical polymer is crosslinkable, the process may further comprise crosslinking the nonlinear optical polymer. The crosslinking may occur before poling, during poling, after poling, or any combination thereof. The crosslinking may occur by exposing the nonlinear optical polymer to heat, actinic radiation, or any combination thereof. Depositing the nonlinear optical polymer may comprise spin coating, dip coating, or brushing. In most embodiments, the index of refraction of the nonlinear optical polymer is higher than the index of refraction of the lower surface.

The substrate may comprise more than two polymer micro-ridges. The length of the polymer micro-ridges may be about 2 μm to about 300 mm. Preferably, the polymer micro-ridges are interdigitated.

Another embodiment is a process comprising: a) reacting an alkoxysilane, an (epoxy)alkoxysilane, and a fluorinated alkoxysilane to form a fluorinated sol-gel polymer; and b) reacting a nonlinear optical chromophore comprising a donor, a π-bridge, an acceptor, and at least one alkoxysilyl group with the fluorinated sol-gel polymer to form a nonlinear optical fluorinated sol-gel polymer. The resulting nonlinear optical sol-gel polymer can then be formed into structures that can be poled to induce electro-optic activity. The nonlinear optical sol-gel polymer can be heated to crosslink the material, which increases the stability of the electro-optic activity and the mechanical strength of the material. The alkoxy group of the alkoxysilane, the (epoxy) alkoxysilane, the (fluoroalkyl)alkoxysilane, or the alkoxysilyl group of the nonlinear optical chromophore may, independently at each occurrence, be methoxy, ethoxy, propoxy, isopropoxy, butoxy, or any combination thereof. Preferably, the alkoxysilane is a tetraalkoxysilane. In some embodiments, the (epoxy)alkoxysilane may further comprise one alkyl group or may comprise two epoxy groups. Preferably, the (epoxy)alkoxysilane comprises an epoxyalkyl group, an epoxycycloalkyl group, or any combination thereof. Some examples of epoxyalkyl or epoxycycloalkyl groups are the 3-(2,3-epoxypropoxy)propyl group, the 5,6-epoxyhexyl group, and the 2-(3,4-epoxycyclohexyl)ethyl group. The fluorinated alkoxysilane may comprise a fluorinated group including up to about 20 carbon atoms. The fluorinated groups remain in the polymer after curing. Some examples of fluorinated groups include the 3,3,3-trifluoropropyl group, the 3-heptafluoroisopropoxy)propyl group, the pentafluorophenyl, pentafluoro-phenylpropyl group, the perfluoro-1,1,2,2-tetrahydrohexyl group, the perfluoro-1,1,2,2-tetrahydrooctyl group, the perfluoro-1,1,2,2-tetrahydrodecyl group, the perfluoro-1,1,2,2-tetrahydrododecyl group, and the perfluoro-1,1,2,2-tetrahydrododecyl group. The fluorinated alkoxysilane may also comprise two fluoroalkyl groups. In other embodiments, the fluorinated alkoxysilane group may comprise a fluorocycloalkyl group.

Properties of the composition such as refractive index, electro-optic coefficient, and glass transition temperature, as well as the processibility of the composition, can be changed by changing the ratio of the fluorinated alkoxysilane to the (epoxy)alkoxysilane and/or by changing the loading weight percent of the nonlinear optical chromophore. For example, increasing the amount of fluorinate alkoxysilane with respect to the (epoxy)alkoxysilane will tend to decrease the refractive index of the system if the amount of nonlinear optical chromophore is held constant. Increasing the loading percent of the nonlinear optical chromophore will tend to increase the refractive index. Preferably, the molar ratio of the fluorinated alkoxysilane to the (epoxy)alkoxysilane in the process described above is greater than about 0.1 to 4. Preferably, the weight percent of the nonlinear optical chromophore in the fluorinated sol-gel polymer is about 10 weight percent to about 50 weight percent. Preferably, reacting the tetraalkoxysilane, the (epoxy)alkoxysilane, and the fluorinated alkoxysilane comprises catalysis with a catalyst comprising deuteriochloric acid (DCl) in deuterium oxide ($D_2O$).

Preferably, the process further comprises c) forming a thin film comprising the nonlinear optical fluorinated sol-gel on a substrate; and d) poling the nonlinear optical fluorinated sol-gel to form an electro-optic fluorinated sol-gel. Forming the thin film may comprise spin coating, dip coating, or brushing. The substrate may further comprise a cladding material that has an index of refraction lower than the index of refraction of the electro-optic fluorinated sol-gel. Preferably, the cladding material comprises a polymer.

Figure 10:
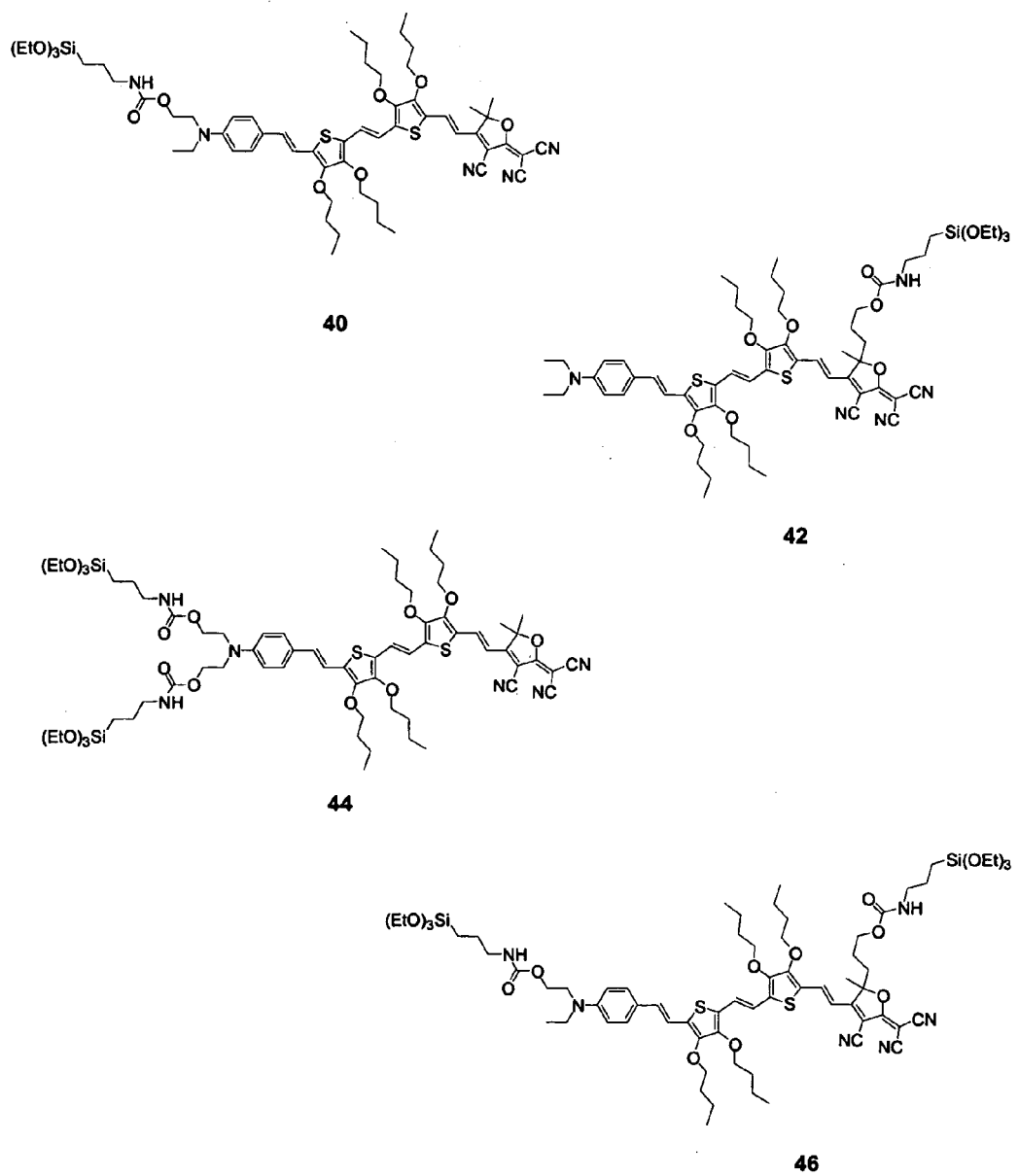
FIG. 10 illustrates some examples of nonlinear optical chromophores containing alkoxysilyl groups.
Figure 11:
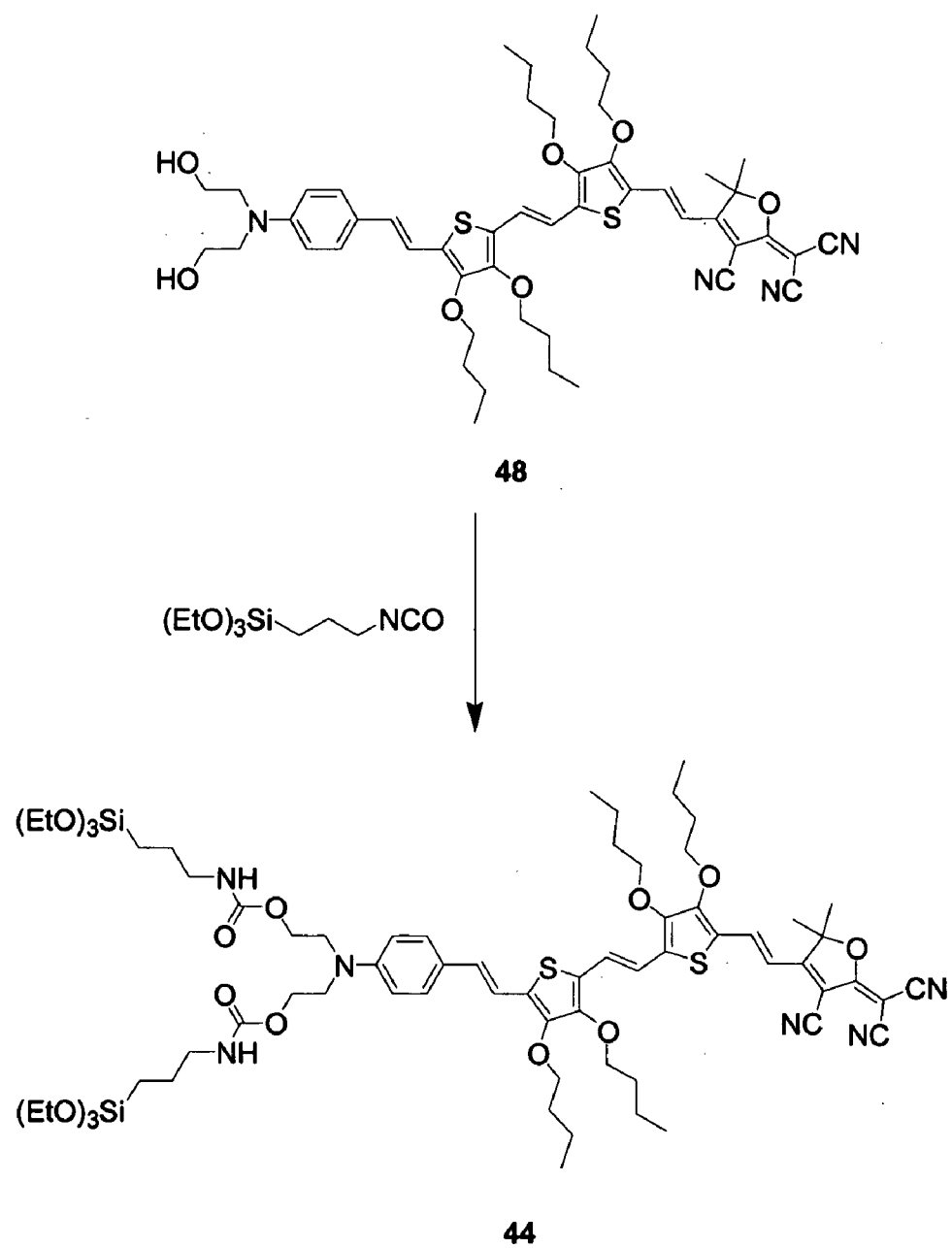
FIG. 11 is a scheme for preparing an example of a nonlinear optical chromophore containing two alkoxysilyl groups.

The alkoxysilyl group of the nonlinear optical chromophore is preferably a trialkoxysilyl group. Referring to FIG. 10, the alkoxysilyl group of the nonlinear optical chromophore may be attached to the donor (for example 40) or to the acceptor (for example 42). In some embodiments, the nonlinear optical chromophore comprises two alkoxysilyl groups. Preferably, the two alkoxysilyl groups are attached to the donor (for example 44). In some embodiments, one alkoxysilyl group is attached to the donor and one alkoxysilyl group is attached to the acceptor (for example 46). Alkoxysilyl groups may be attached chromophores by reaction of a reactive functional group of one the alkoxysilyl group or chromophore with a complimentary reactive functional group on the other of the alkoxysilyl group or chromophore. Some examples of reactive functional groups/complimentary reactive functional groups are isocyanates/alcohols, isocyanates/amines, acid chlorides/alcohols, and acid chlorides/amines. FIG. 11 illustrates a scheme of an example where alcohols on the chromophore (48) are reacted with an isocyanate of the alkoxysilyl group.

Preferably, the π-bridge of the nonlinear optical chromophore comprises a thiophene ring having oxygen atoms bonded directly to the 3 and 4 positions of the thiophene ring, for example

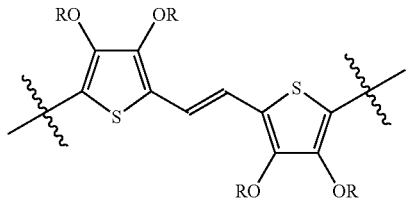

wherein R is an alkyl group, a heteroalkyl group, an aryl group, or a heteroaryl group.

Another embodiment is a composition made by the process described above. Such compositions may be useful, for example, in fabrication electro-optic devices. Other embodiments include electro-optic devices comprising the composition made by the process described above. The electro-optic devices may include, for example, Mach-Zehnder modulators, directional couplers, and micro-ring resonators.

EXAMPLES

The following example(s) is illustrative and does not limit the Claims.

The following example describes the preparation of microelectrodes that include polymer micro-ridges, where the gap between the microelectrodes was about 14 μm.

A 6 inch Si/SiOx (1 μm) wafer or quartz wafer was cleaned in aqueous $H_2O_2/NH_4OH$ at 70° C. for 10 minutes, dump-rinsed with 18 megaohm water 6 times, and spin-rinse dried. The wafer was then further cleaned with oxygen plasma for 7 minutes. An adhesion promoter (1% by weight of poly(N-(2-aminoethyl)-3-aminopropylmethyl-dimethoxysilane) in isopropyl alcohol was filtered through a 0.1 µm Teflon filter and spin deposited on the wafer at 500 rpm for 3 sec and 3000 rpm for 30 sec. The wafer was then heated on a nitrogen-flushed hotplate for 7 min at 100° C.

A UV curable acrylate resin 45% by weight in solvent was filtered through 0.1 mm Nylon filter and spin deposited on the wafer at 500 rpm for 3 sec and 1000 rpm for 30 sec. The resin was baked at 50° C. for 60 min in a vacuum oven. The wafer was passed under a UV lamp on a conveyor belt until the resin was cured to hardness. The resulting layer of UV crosslinked polymer was 3.4 µm thick. A second layer of UV crosslinked polymer was then deposited on the first layer to give a UV crosslinked polymer film with a thickness of about 7 µm.

A thin film of titanium used to form a dry etching hardmask was deposited on the UV crosslinked polymer thin film as described in co-pending, commonly assigned U.S. application Ser. No. 10/264,461. The band-shaped polymer micro-ridges were dry etched by: 1) dry etching the titanium thin film with 12.5 sccm $SF_6$/10 sccm Ne at 20 mTorr and 170V reactive ion etching (RIE) for 4 min) to form the hardmask; 2) dry etching the UV crosslinked polymer with 100 sccm $O_2$ at 6 mTorr and 240 V for 15 min, breaking for 10 min, and then repeating the 15 min $O_2$ etch/10 min break cycle eleven times; and 3) dry etching the titanium hardmask with 12.5 sccm $SF_6$/10 sccm Ne at 20 mTorr and 170V RIE for 4 min.

The wafer was then flood exposed to UV light for 100 sec, immersed in MF24A developer from Cyantek for 5 min, and sprayed with MF24A developer. The wafer was dump-rinsed with 18 megaohm water twelve times, spin-rinse dried, and cleaned with 100 sccm of $O_2$ at 20 mTorr and 220V for 3 min. This provided the substrate comprising polymer micro-ridges.

An adhesion layer of titanium was deposited on the substrate by presputtering for 360 sec and sputtering for 100 sec. After 30 min, a layer of platinum was deposited by presputtering for 360 sec and sputtering for 80 sec. After a 30 sec vent, gold was deposited on the substrate by presputtering for 360 sec and sputtering for a total of 44 min. The gold sputtering was broken down into cycles of about 30 sec vent times followed by 100 sec of sputtering.

A 4.5 µm thick layer of SPR220-45 photoresist from Shipley was spin deposited on the wafer and soft baked in the vacuum oven for 16 h at $10^{-3}$ Torr. The clear field of the photolithographic mask was aligned over the lower surface. The photoresist was exposed for 20 sec at 32 mW/cm$^2$. The pattern was developed to provide via to the lower surface. The gold was wet etched with aqueous potassium iodide/iodine wet etchant for 2 min. The remaining photoresist was stripped with RS112 from Cyantek for 2 min. The wafer was then immersed in a bath of isopropyl alcohol for 1 min, immersed in a second bath of isopropyl alcohol for an additional 1 min, dump-rinsed with 18 megaohm water twelve times, and then spin-rinse dried. The titanium and platinum adhesion layer was removed from the lower surface by dry etching with 12.5 sccm of $SF_6$/90 sccm Ne at 20 mTorr with 300W inductively coupled plasma (ICP)/170V RIE for 5 min followed by waiting for 10 min. The dry etch/wait process was repeated seven times.

Inducing electro-optic activity in a nonlinear optical polymer was used to demonstrate the performance of the electrodes fabricated above. A fluorinated nonlinear optical sol-gel polymer (described below) was spin coated on the wafer at 400 rpm for 40 sec and 600 rpm for 30 sec. The wafer was baked at 100° C. for 10 min and 190° C. for 1.5 h on a nitrogen-flushed hot plate. Areas of polymer were physically removed to make electrical contact with the electrodes. At room temperature, 850 V was applied to the sample and the sample was heated to 140° C. and maintained at 140° C. for 500 sec. The sample was then heated to about 180° C. over 1000 sec and then cooled to room temperature over 1500 sec. A laser beam was focused on the sample and a second harmonic generation (SHG) signal demonstrated that the voltage applied induced electro-optic activity in the nonlinear optical polymer between the electrodes.

The following example describes the preparation of a fluorinated nonlinear optical sol-gel.

Preparation of the Chromophore:

Referring to FIG. 11, a trialkoxysilyl-functionalized chromophore was prepared from chromophore 48. Chromophore 48 can be prepared as described in copending, commonly assigned U.S. application Ser. No. 10/301,978. A solution of 12 g (0.0134 mol) of 48, 13.3 g (0.0536 mol) of freshly distilled 3-(triethoxysilyl)propyl isocyanate, and a catalytic amount of dibutyltin dilaurate (5 drops) were dissolved in a total of 300 mL of dry THF and the resulting solution was refluxed for 4 hours. The reaction was allowed to cool to room temperature and the THF was removed under reduced pressure. The crude material was purified by flash column chromatography (eluent=hexanes/$CH_2Cl_2$/ethyl acetate, 2:4:2) to give 12 g (64%) of the trialkoxysilyl-functionalized chromophore 44 as a dark blue solid.

Preparation of a Fluorinated Sol-Gel:

A fluorinated sol-gel was prepared by adding 99.96 g (0.48 mol) of tetraethoxysilane, 236.3 g (0.12 mol) of 3-glycidoxypropyltrimethoxysilane, 122.40 g (0.24 mol) of tridecafluorotetrahydrooctyltriethoxysilane, and 312 g of isopropyl alcohol to a 1 L round bottom flask. The resulting mixture was stirred and a solution of 4.32 g of 2M DCl in 60 g of $D_2O$ was added dropwise slowly until the mixture became clear. The resulting solution was refluxed for 3 h then allowed to cool to room temperature overnight. The isopropyl alcohol and other volatile reaction products were removed under reduced pressure. The resulting solution was diluted with 200 g of n-butanol, 40 g of cyclopentanone, and stored in 0° C. refrigerator.

Figure 12:
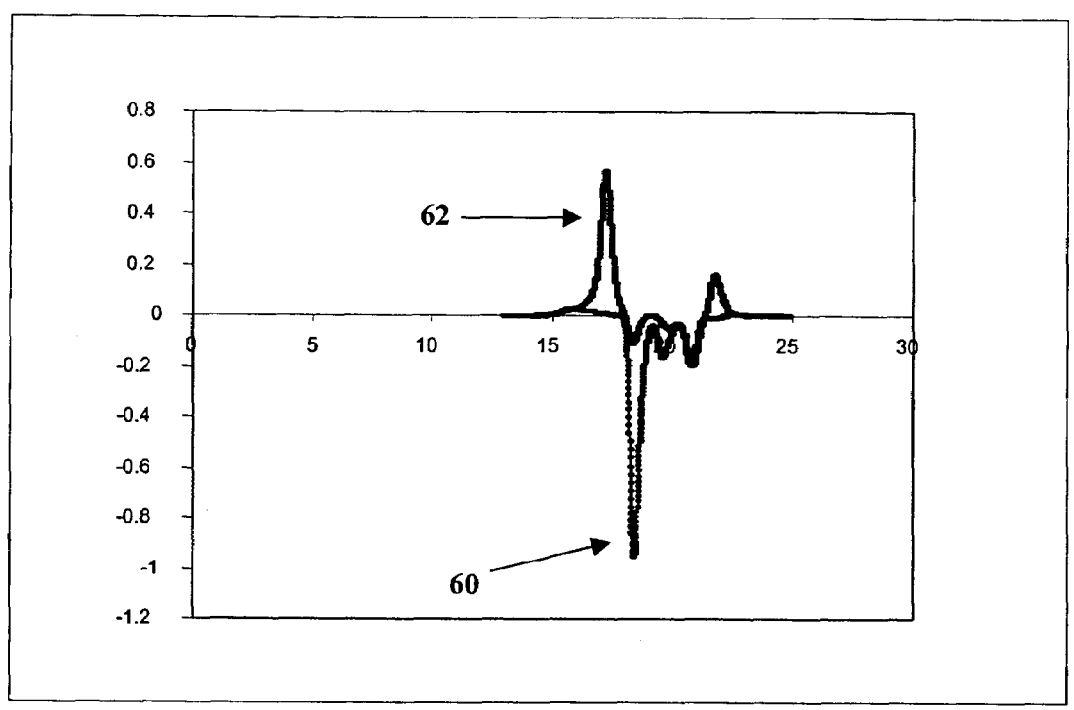
FIG. 12 is a combined GPC trace of a fluorinated sol-gel polymer and a fluorinated sol-gel polymer including a nonlinear optical chromophore.

Preparation of a Fluorinated Nonlinear Optical Sol-Gel:

A fluorinated nonlinear optical sol-gel was prepared by dissolving 1.74 g of 44 in 10 g of distilled cyclopentanone. The resulting solution was added dropwise slowly with stirring to 24.858 g of the fluorinated sol-gel solution prepared above (solid concentration was 33.15 wt %). To the resulting solution was added 0.0698 g of distilled water and the reaction was immersed in a 70° C. bath with magnetic stirring. Typically, the reaction lasts two to three days to incorporate about 17% by weight of the chromophore with respect to the fluorinated sol-gel. The incorporation of the chromophore was evidenced with GPC using refractive index detection. The GPC trace of the fluorinated sol-gel with THF as the solvent gave a "negative peak" 60 (FIG. 12) because the refractive index of the fluorinated sol-gel was lower than the refractive index of THF. The GPC trace of the fluorinated nonlinear optical sol-gel with THF gave a "positive peak" 62 (FIG. 12) because incorporation of the chromophore raised the refractive index of the fluorinated nonlinear optical sol-gel higher than the refractive index of THF. The volatiles from the above reaction were removed under reduced pressure to give a solution that could be deposited to form a thin film.

The fluorinated nonlinear optical sol-gel prepared above was spin deposited on a 2" ITO covered glass wafer to give a 5.9 µm thick film. The film was cured at 190° C. for 30 minutes to give a refractive index of 1.446±0.002 at 1.5 µm. The same solution was spin coated on an ITO coated glass substrate and cured at 180° C. for about 100 sec, followed by cooling to 50° C. over about 100 sec. The film was corona poled by applying about 3.75 V through a needle and heating the sample to 190° C. over about 200 sec. The film was poled at 190° C. for about 300 sec then the applied voltage was increased to about 8 kV. After about 100 sec, the film was cooled to about 100° C. over about 100 sec and then heated again to 190° C. over about 200 sec. The film was poled at 190° C. for a further 150 sec at 8 kV, then cooled to room temperature over about 300 sec. The $r_{33}$ at 1.3 µm determined by the Teng-Man method was 36 pm/V.

Other embodiments are within the following claims.

The invention claimed is:

1. A process for fabricating a microelectrode, comprising: a) providing a substrate comprising at least one polymer micro-ridge, wherein the polymer micro-ridge comprises an upper surface and two walls, the two walls forming an angle with a lower surface; b) depositing a metal thin film on the upper surface, the two walls, and the lower surface; and c) etching a predetermined amount of the deposited metal thin film on the lower surface to form the microelectrode.

2. The process of claim 1, wherein etching a predetermined amount of the deposited metal thin film on the lower surface comprises wet etching, dry etching, ion beam bombardment, or any combination thereof.

3. The process of claim 1, wherein providing the substrate comprising at least one polymer micro-ridge comprises molding, imprinting, photolithographic patterning, imprint lithography, or any combination thereof.

4. The process of claim 1, wherein providing the substrate comprising at least one polymer micro-ridge comprises dry etching a polymer thin film.

5. The process of claim 1, wherein the polymer micro-ridge comprises a linear polymer, a crosslinked polymer, an organically modified sol-gel, or any combination thereof.

6. The process of claim 1, wherein the lower surface comprises silicon dioxide.

7. The process of claim 1, wherein the lower surface comprises a polymer.

8. The process of claim 7, wherein the lower surface comprises a linear polymer, a crosslinked polymer, an organically modified sol-gel, or any combination thereof.

9. The process of claim 1, wherein the polymer micro-ridge and the lower surface comprises the same polymer.

10. The process of claim 1, wherein the angle between the two walls and the lower surface is about 90 degrees.

11. The process of claim 1, wherein the upper surface and lower surface are substantially parallel.

12. The process of claim 11, wherein the walls are substantially perpendicular to the upper surface and the lower surface.

13. The process of claim 1, wherein the substrate comprises a plurality of polymer micro-ridges.

14. The process of claim 13, wherein the micro-ridges are interdigitated.

15. The process of claim 1, wherein the metal thin film is selected from the group consisting of gold, platinum, titanium, and any combination thereof.

16. The process of claim 1, wherein depositing the metal thin film according to a process comprises physical vapor deposition, thermal evaporation, electroplating, or any combination thereof.

17. A process for fabricating a microelectrode comprising: a) providing a substrate comprising at least one polymer micro-ridge, wherein the polymer micro-ridge comprises an upper surface and at least one wall, the wall forming an angle with a lower surface; b) depositing a metal thin film on the upper surface, the wall, and the lower surface; c) etching a predetermined amount of the deposited metal thin film on the lower surface or the deposited metal thin film on the upper surface; and d) etching a predetermined amount of the remaining of the deposited metal thin film on upper surface or the deposited metal thin film on the lower surface, thereby leaving a metal thin film on the wall.

18. The process of claim 17, wherein etching a predetermined amount of the deposited metal thin film on the lower surface, upper surface, or both according to a process comprises wet etching, dry etching, ion beam bombardment, or any combination thereof.

19. The process of claim 17, comprising first etching a predetermined amount of the deposited metal thin film on the upper surface, and then etching a predetermined amount of the deposited metal thin film on the lower surface.

20. The process of claim 17, comprising first etching a predetermined amount of the deposited metal thin film on the lower surface, and then etching a predetermined amount of the deposited metal thin film on the upper surface.

21. The process of claim 17, wherein providing the substrate comprising at least one polymer micro-ridge comprises molding, imprinting, photolithographic patterning, imprint lithography, or any combination thereof.

22. The method of claim 17, wherein providing the substrate comprising at least one polymer micro-ridge comprises dry etching a polymer thin film.

23. The process of claim 17, wherein the polymer micro-ridge comprises a linear polymer, a crosslinked polymer, an organically modified sol-gel, or any combination thereof.

24. The process of claim 17, wherein the lower surface comprises silicon dioxide.

25. The process of claim 17, wherein the lower surface comprises a polymer.

26. The process of claim 25, wherein the lower surface comprises a linear polymer, a crosslinked polymer, an organically modified sol-gel, or any combination thereof.

27. The process of claim 17, wherein the polymer micro-ridge and the lower surface comprise the same polymer.

28. The process of claim 17, wherein the angle between the two walls and the lower surface is about 90 degrees.

29. The process of claim 17, wherein the upper surface and lower surface are substantially parallel.

30. The process of claim 29, wherein the walls are substantially perpendicular to the upper surface and the lower surface.

31. The process of claim 17, wherein the substrate comprises a plurality of polymer micro-ridges.

32. The process of claim 31, wherein the polymer micro-ridges are interdigitated.

33. The process of claim 17, wherein the metal thin film is selected from the group consisting of gold, platinum, titanium, and any combination thereof.

34. The process of claim 17, wherein depositing the metal thin film according to a process comprises physical vapor deposition, thermal evaporation, electroplating, or any combination thereof.

* * * * *